United States Patent [19]

Paulson et al.

[11] Patent Number: 5,121,055
[45] Date of Patent: Jun. 9, 1992

[54] VERIFICATION OF THE OPERATION OF A BIOMAGNETOMETER

[75] Inventors: Douglas N. Paulson, Del Mar; Matthew Lake, San Diego, both of Calif.

[73] Assignee: Biomagnetic Technologies, Inc., San Diego, Calif.

[21] Appl. No.: 558,629

[22] Filed: Jul. 26, 1990

[51] Int. Cl.⁵ ............................................. G01R 35/00
[52] U.S. Cl. ....................................... 324/202; 324/300
[58] Field of Search ............... 324/200, 201, 202, 244, 324/248, 260, 261, 262, 300, 301, 302, 304, 318; 250/252.1; 378/207; 128/653 R, 630, 899, 901

[56] References Cited

U.S. PATENT DOCUMENTS

| | | | |
|---|---|---|---|
| 3,557,777 | 1/1971 | Cohen | 324/258 X |
| 3,980,076 | 9/1976 | Wikswo, Jr. et al. | 324/248 X |
| 4,079,730 | 3/1978 | Wikswo, Jr. et al. | 324/224 X |
| 4,386,361 | 5/1983 | Simmonds | 307/306 X |
| 4,403,189 | 9/1983 | Simmonds | 324/248 |
| 4,751,464 | 6/1988 | Bridges | 324/318 |
| 4,793,355 | 12/1988 | Crum et al. | 324/201 X |

Primary Examiner—Kenneth A. Wieder
Assistant Examiner—W. S. Edmonds
Attorney, Agent, or Firm—Gregory Garmong

[57] ABSTRACT

The operation of a biomagnetometer is verified using a tool containing a dipole source of known strength having a fixed, known position. The tool includes a hollow nonconducting and nonmagnetic sphere filled with an electrically conducting fluid, and at least one well-characterized dipole source within the fluid. The position of the dipole source relative to fixed locations on the surface of the sphere is established by X-ray measurement, and the the fixed surface locations and strength of the dipole source are measured with the biomagnetometer. The position and strength of the dipole source determined in this manner are compared with the known position and strength of the dipole source, to verify the operation of the biomagnetometer.

16 Claims, 2 Drawing Sheets

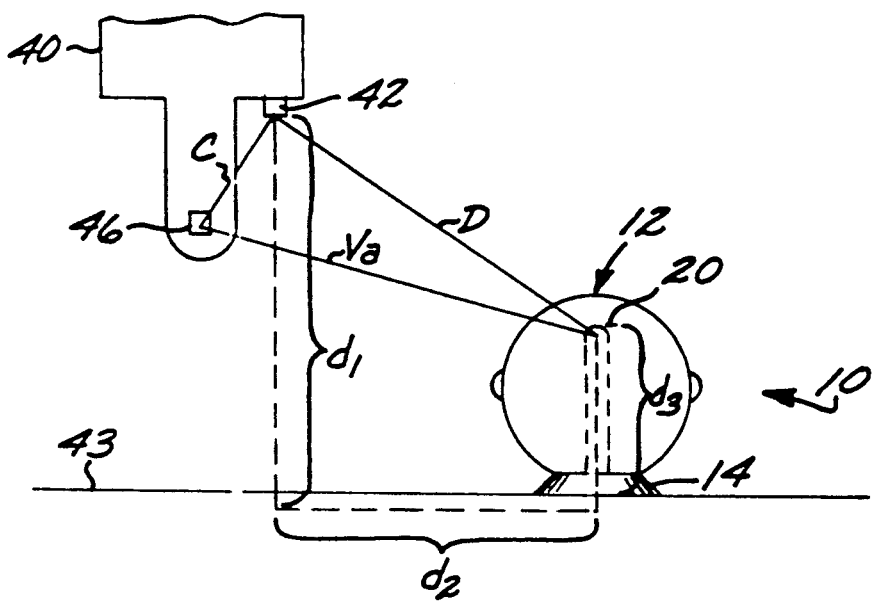
FIG.3
FIG.4
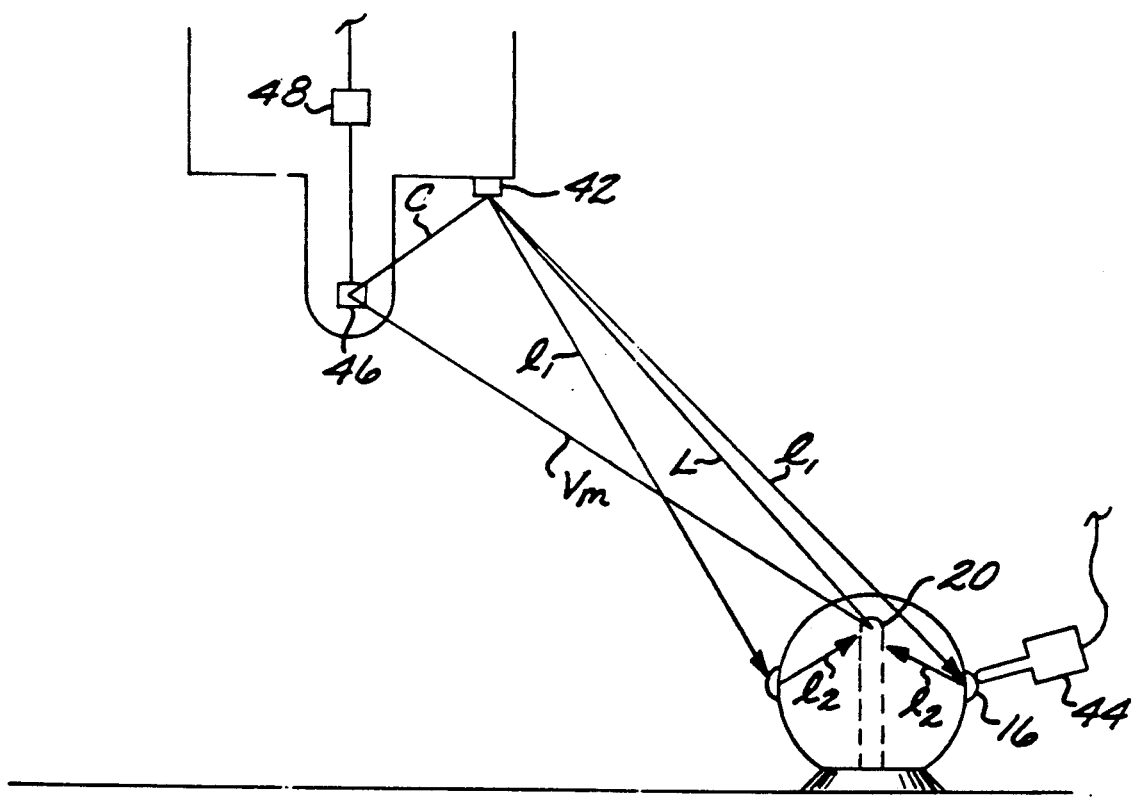

VERIFICATION OF THE OPERATION OF A BIOMAGNETOMETER

BACKGROUND OF THE INVENTION

This invention relates to biomagnetometers, and, more particularly, to the verification of the proper operation of a biomagnetometer.

The biomagnetometer is an instrument that has been developed for measuring magnetic fields produced by the body, particularly the brain. The biomagnetometer is necessarily a very sensitive measurement instrument, because the magnetic fields produced by the brain are small. The strength of the magnetic field produced by the brain is typically about 0.000000001 Gauss, at a distance of 1-2 centimeters from the head. By comparison, the strength of the earth's magnetic field is about 0.5 Gauss, or about five hundred million times larger than the strength of the magnetic field of the brain, as measured externally to the head.

The biomagnetometer includes a magnetic pickup coil connected to a very sensitive detector of magnetic signals. The currently most widely used detector is a Superconducting QUantum Interference Device or SQUID, which, in combination with a superconducting pickup coil, is sufficiently sensitive to detect magnetic signals produced by the brain. (See, for example, U.S. Pat. Nos. 4,386,361 and 4,403,189, whose disclosures are incorporated by reference, for descriptions of two types of SQUIDs.) The detector, pickup coil, and their associated equipment require special operating conditions such as a cryogenic dewar, and cannot be placed into the body or attached directly to the surface of the body. The dewar is operated with its interior at liquid helium temperature (about 4.2 K), to maintain the SQUID detector, the pickup coil, and the electrical connection between them in the superconducting state because of the small electrical currents involved, and to reduce the electrical noise that might otherwise influence the SQUID detector.

Special electronics is provided to filter out external effects such as the earth's magnetic field and other electrical sources. (For a description of the electronics, see U.S. Pat. Nos. 3,980,076 and 4,079,730, whose disclosures are herein incorporated by reference.) The subject and detector can also be placed into a magnetically quiet enclosure that shields the subject and the detector from the external magnetic fields. (For a description of such an enclosure, see U.S. Pat. No. 3,557,777, whose disclosure is herein incorporated by reference.) With these special provisions, medical researchers and doctors can now make accurate, reliable measurements of the magnetic fields produced by the brain either spontaneously or responsive to external stimuli.

Not only is it important to measure the field strength produced by the brain, but it is important to know the location in the head from which the magnetic field arises. The position of the head relative to the dewar, and thence the pickup coil, can be measured by an electromagnetic positioning system constructed so as not to interfere with the operation of the detector. The automatic position indicating system is described in U.S. Pat. No. 4,793,355, whose disclosure is incorporated by reference. A current version of the electromagnetic position indicating system can record the location of a magnetic source to within about 2 millimeters.

Because the position measurement system and the magnetic field measurement system of the biomagnetometer are complex in construction and operation, it is important to have a methodology for verifying that both are operating correctly. Only when proper operation is verified can the results be given their most meaningful interpretation. There have been proposed several techniques for such verification, including a "phantom" approach wherein a model head is provided with an internal source. However, for various reasons these prior techniques have not proved themselves to be sufficiently precise to verify the operation of the improved biomagnetometer systems today available.

There is therefore a need for an improved approach for verifying the operation of a biomagnetometer. The present invention fulfills this need, and further provides related advantages.

SUMMARY OF THE INVENTION

The present invention provides an apparatus and technique for verifying the operation of a biomagnetometer having an automatic position indicating system. The tool used in the approach is relatively simple in construction, and provides a reproducible evaluation of the position and detection systems of the biomagnetometer. The verification test exercises the various subsystems of the biomagnetometer on the tool, which is a good test of the operation with respect to a human subject.

In accordance with the invention, a biomagnetometer operational verification tool comprises a hollow sphere having a wall made of a material that is electrically nonconducting and nonmagnetic, the radius of the sphere being constant to within less than about 5 percent of the radius; a mass of an electrically conducting fluid within the sphere, the fluid mass having substantially no bubbles therein; and at least one electrical dipole source within the sphere.

The invention also deals with the use of the tool in biomagnetometer systems verification. In accordance with this aspect of the invention, a process for verifying the operation of a biomagnetometer comprises the steps of providing a biomagnetometer operational verification tool, comprising a hollow sphere having a wall made of a material that is electrically nonconducting and nonmagnetic, the radius of the sphere being constant to within less than about 5 percent of the radius, at least three noncolinear position locating tabs on the exterior wall of the sphere; a mass of an electrically conducting fluid within the sphere, the fluid mass having substantially no bubbles therein, at least one electrical dipole source at a known position within the sphere, and a constant current supply for the dipole source; establishing the position of the dipole source relative to the tabs; determining the position of the tabs and the apparent strength of the dipole source using a biomagnetometer; calculating the position and strength of the dipole source from the results of the steps of establishing and determining; and comparing the position and strength of the dipole source from the step of calculating with the known position and strength of the dipole source.

The verification tool, colloquially termed the "phantom", is constructed as a perfectly round hollow sphere, or as close thereto as possible. In some prior studies, phantom-type devices were made with shapes that approximated the shape of the head. It has now been found that the analysis of such shapes is sufficiently complex that the studies made using such devices were as much a test of the mathematical modeling as a verification of the operation of the biomagnetometer, which is contrary to the objective of verifying the operation of the biomagnetometer.

The sphere is filled with a conductive fluid, preferably a weak saline solution that approximates the density and electrical conduction properties of the brain matter inside the head. Care is taken to avoid bubbles in the fluid, as the bubbles can interfere with obtaining reproducible data. The dipole source is preferably made from a twisted pair of platinum wires of relatively large diameter, as about 0.5 millimeters diameter, whose ends are separated by about 4 millimeters distance. The use of platinum prevents degradation of the wire over extended periods of time in contact with the saline solution, and the large diameter reduces the impedance and high voltages that might cause electrolysis of the water in the saline solution. (Once an operable verification tool is assembled, it is desirable to leave it undisturbed and unchanging in characteristics over time.) A current is applied between the wire ends that form the dipole from a constant current source, which gives more reproducible results that obtained with a constant voltage source.

The actual position and actual strength of the dipole source are known from the geometry of the tool, as manufactured, and the magnitude of the current applied to each dipole. Normally one or more of the dipole sources is placed along the vertical radius of the spherical tool, at a preselected location. The dipole sources are operated one at a time, with a known applied current, to permit verification of system operation for sources of varying depth from the surface of the tool.

The location and strength of the dipole source are measured with the biomagnetometer, and these measurements are compared with the actual values. To measure the position of the dipole source relative to the biomagnetometer by a preferred approach, the tool is first X-rayed to determine the location of the dipoles in relation to the fixed tabs on the surface of the tool. Once this information is known, the tool is placed into the biomagnetometer and the positions of the tabs determined with the automatic position sensing system such as described in U.S. Pat. No. 4,793,355. From a vector calculation such as that described in relation to FIG. 8 of the '355 patent (except made relative to the verification tool rather than a human head), the positions of the dipole sources relative to the biomagnetometer can be calculated. The actual and calculated positions are compared, to verify that the biomagnetometer is operating properly. If the two positions are the same to within a preselected acceptable error limit, measurements on subjects can begin. If the positions are not the same, the calibration of the biomagnetometer may be checked and the verification repeated until correspondence is reached.

The present approach provides a direct technique that verifies the operation of the biomagnetometer without reliance on complex mathematical models of the tool. Other features and advantages of the invention will be apparent from the following more detailed description of the preferred embodiment, taken in conjunction with the accompanying drawings, which illustrate, by way of example, the principles of the invention.

BRIEF DESCRIPTION OF THE DRAWINGS

FIG. 3 is a diagrammatic illustration of the determination of the position of the dipole source using its known position;

FIG. 4 is a diagrammatic illustration of the determination of the position of the dipole source using the electromagnetic position determining system.

DETAILED DESCRIPTION OF THE PREFERRED EMBODIMENT

In accordance with a preferred embodiment, a biomagnetometer operational verification tool comprises a hollow sphere having a wall made of an electrically nonconducting and nonmagnetic material selected from the group consisting of glass and plastic, the radius of the sphere being about 10 centimeters and constant to within less than about 2 millimeters; at least three noncolinear position locating tabs on the exterior wall of the sphere, the tabs being made of a metal that is visible in an X-ray of the sphere; a mass of saline solution within the sphere, the fluid mass having substantially no bubbles therein; at least two electrical dipole sources within the sphere, each dipole sources being formed of a twisted pair of platinum wires whose ends are spread apart to form a dipole having its centerline on the vertical radius of the sphere; and a constant current supply for the diple sources.

Figure 1:
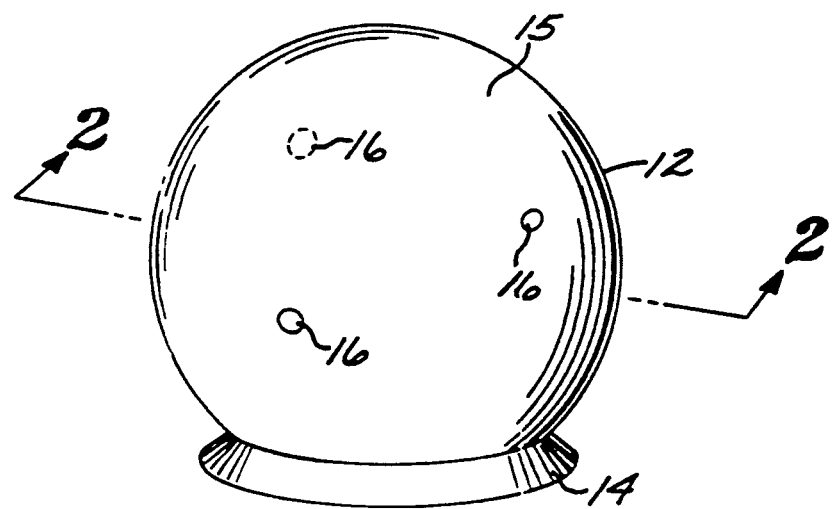
FIG. 1 is a perspective view of a verification tool.

A preferred verification tool 10, illustrated in FIG. 1, includes a hollow sphere 12 supported on a base 14. On the outside of a wall 15 of the sphere 12 are three noncolinear tabs 16 made of a material that is visible in an X-ray of the sphere 12, such as dots of lead paint or small pieces of lead foil. The use of the tabs 16 will be explained subsequently.

Figure 2:
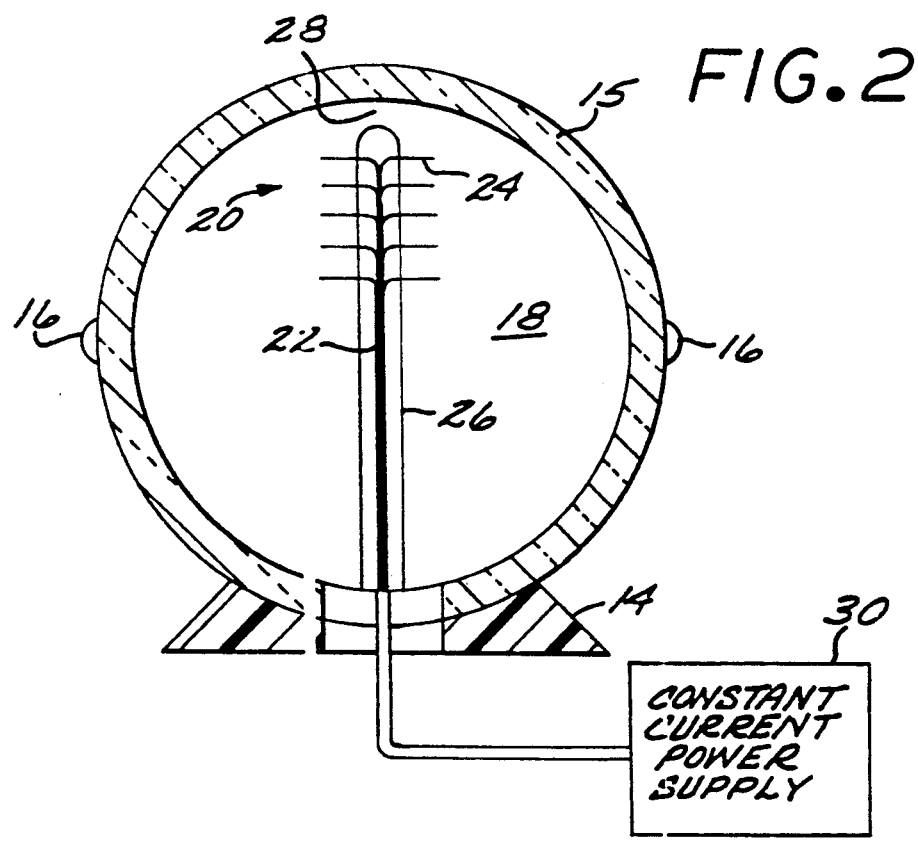
FIG. 2 is an enlarged sectional view of the verification tool of FIG. 1, taken along lines 2—2.

A side sectional view of the sphere 12 is presented in FIG. 2, illustrating its interior structure. The wall 15 must be a perfect sphere of constant radius to an accuracy of less than about 5 percent. In a preferred embodiment, the radius of the sphere is about 10 centimeters, so the radius cannot vary by more than about 5 millimeters. If the variation of radius is greater than this permitted tolerance, the tool 10 does not function properly. More preferably, the variation of the radius of the sphere is less than about 2 percent, or 2 millimeters in a sphere of 10 centimeters radius, to achieve the best performance. Errors in the radius of the sphere produce corresponding errors in the certainty of the biomagnetometer position readings.

The wall 15 is made of a material that is electrically nonconducting and nonmagnetic. The preferred material of construction is glass or plastic, in a thickness of about 2 millimeters. The wall thickness is not critical.

An interior volume 18 of the sphere 12 is filled with an electrically conducting fluid. The fluid is preferably a saline solution of 0.9 percent by weight sodium chloride in water. Saline solution approximates the electrical characteristics of brain matter. Great care is taken to exclude air bubbles or any other foreign matter from the interior volume 18. Air bubbles, for example, distort the magnetic field produced within the sphere 12 because their electrical conductivity differs from that of the saline solution. Bubbles can be excluded with the exercise of care during filling. A transparent glass or plastic is preferred for use in constructing the wall 15, because the elimination of bubbles from the interior volume 18 during filling, and their possible reappearance during use, can be observed visually. If bubbles appear during use of the tool 10, the sphere 12 must be refilled or other action taken to remove the bubbles. The presence of bubbles or other foreign matter explains the lack of success with some prior attempts to provide a verification tool.

At least one, and preferably several, dipole sources 20 are provided in the interior of the sphere 12. Each dipole source is formed from a twisted pair of platinum wires 22 whose upper free ends 24 are bent 90 degrees and spread apart to form a T-shape, preferably with the tips of the ends 24 separated by about 4 millimeters. The diameter of the platinum wire is preferably large, to reduce its impedance and the likelihood of hydrolysis of the water in the saline solution when a voltage is applied.

Several different compositions of wires were tried, and platinum was found to be the most satisfactory. Silver wires, silver-coated wires, platinum-iridium wires, sintered silver chloride wires, bare copper wires, and gold-coated copper wires were less satisfactory but operable for a period of time. Various diameters of wires were tried, and a large diameter was found preferable. A platinum wire of diameter about 0.5 millimeters was found to be most satisfactory, with impedances of about 20,000-200,000 ohms over the current and frequency ranges of interest.

Long term stability is a desirable characteristic of the verification tool. Thus, the appearance of bubbles or change in electrical characteristics due to corrosion or the like is to be avoided, and the present preferred construction is selected with this objective in mind.

To hold the wire pairs and dipole sources 20 firmly in place at a fixed known location, the pairs of wire 22 are embedded into a cylindrical plastic rod 26 that is supported on the wall 15. The rod 26 has a cylindrical diameter large enough to encase the twisted portion of the wires 22, but small enough so that the ends 24 protrude. The diameter is therefore preferably slightly less than 4 millimeters for the preferred embodiment having a dipole source length of 4 millimeters.

In the preferred form of the invention, there are provided five separate dipole sources 20. The lengths of the twisted wire pairs are such that the centers of the dipole sources 20 are located at 5, 6, 7, 8, and 9 centimeters from the center of the sphere 12, along an upwardly extending radius 28 of the sphere 12.

The magnetic field produced as a function of an applied voltage was studied and found to be nonrepeatable at low duty cycles of 1-2 seconds. A constant current supply 30 was therefore substituted as the power supply for the dipole sources 20. A constant current from the power supply 30 is applied to pair of wires of each dipole source 20. In the most preferred approach, the current is applied in a 5 Hertz sinusoidal wave form to produce a dipole of 2-200 nanoampere-meter strength.

The geometry of the verification procedure is illustrated in FIGS. 3 and 4. FIG. 3 depicts the manner of establishing the actual position of a particular dipole source 20. A liquid helium dewar 40 has an electromagnetic transmitter 42 mounted thereupon. The vector $d_1$ from the transmitter 42 to a datum plane 43, and the vector $d_2$ along the datum plane 43 to the base 14 of the verification tool 10 are measured by conventional tools. The vector $d_3$ from the base 14 to a particular dipole source 20 is known from the construction of the tool 10. A vector D from the transmitter 42 to the dipole 20 is defined as $d_1+d_2+d_3$. A vector C from a magnetic field measurement coil 46 to the transmitter 42 is a constant and measurable from the construction of the dewar 40. The vector $V_a = C + D$ is therefore the "actual" position value of the dipole 20 relative to the field measurement coil 46 against which the operation of the sensing system is compared.

FIG. 4 illustrates the approach for verifying the operation of the electromagnetic position measuring system. As a preliminary step, the sphere 12 is X-rayed. A relative position vector $l_2$ of the dipole 20 with respect to the tab 16 is measured from the X-ray image. At least three tab references are used to establish the position unambiguously. To perform the verification, the tip of a wand receiver 44 is touched to a particular tab 16. With the tip of the wand receiver 44 in that location, the transmitter 42 is operated to sense the position vector $l_1$ of the tip, and thence the tab 16. (The implementation of this procedure is described in the '355 patent, see particularly col. 11, line 4 et seq.) A vector L from the transmitter 42 to the dipole 20 is $l_1+l_2$. The "measured" vector $V_m$ from the coil 46 to the dipole 20 is therefore $C+L$.

The dipole source 20 is operated at a selected current level, and the electromagnetic activity is sensed by the sensing coil 46 and an associated superconducting quantum interference device 48. The measured electromagnetic source activity and location $V_m$ are compared against the known dipole strength from the current and dipole separation, and the actual location $V_a$. Verification is achieved if the source strengths and locations are in sufficient agreement to within a level of accuracy that is not an absolute but is selected by the manufacturer or user of the system. If the equality is not achieved, then the source of the error must be located and repaired or recalibrated.

It should be noted that the general approach for correlation of data set forth in the '355 patent provides the hardware and analytical basis for the present technique. However, until the present invention it had to be assumed that the system hardware and software of the apparatus of the '355 patent was operating properly. While gross errors could be discerned, fine-scale errors that affect the position determination on the order of a few millimeters could have gone undetected, as could errors as to signal or dipole strength. It was not sufficient to simply make a free space measurement of the position of the wand receiver 44, because in actual practice the sources to be measured are embedded within a medium. The verification tool provides the basis for detecting all types of potential errors in the operation of the biomagnetometer.

Although particular embodiments of the invention have been described in detail for purposes of illustration, various modifications may be made without departing from the spirit and scope of the invention. Accordingly, the invention is not to be limited except as by the appended claims.

What is claimed is:

1. A biomagnetometer operational verification tool, comprising:
   a hollow sphere having a wall made of a material that is electrically nonconducting and nonmagnetic, the radius of the sphere being constant to within less than about 5 percent of the radius;
   a mass of an electrically conducting fluid within the sphere, the fluid mass having substantially no bubbles therein; and
   at least one electrical dipole source within the sphere.

2. The tool of claim 1, wherein the wall of the hollow sphere is made of glass.

3. The tool of claim 1, wherein the wall of the hollow sphere is made of plastic.

4. The tool of claim 1, wherein the fluid within the sphere is an ionic conductor.

5. The tool of claim 1, wherein the fluid within the sphere is an aqueous sodium chloride solution.

6. The tool of claim 1, wherein the dipole source is made of platinum wire.

7. The tool of claim 1, wherein the dipole source is formed of a pair of twisted wires whose ends are spread apart.

8. The tool of claim 1, wherein the radius of the sphere is about 10 centimeters.

9. The tool of claim 1, wherein the variation of the radius is less than about 2 percent of the radius.

10. The tool of claim 1, wherein the centerline of the dipole source is located on the vertical radius of the sphere.

11. The tool of claim 1, further including at least one additional dipole source within the sphere.

12. The tool of claim 1, further including a constant electrical current supply for the dipole source.

13. The tool of claim 1, further including at least three locating tabs on the outer surface of the sphere, the tabs being made of a material visible in an X-ray photograph of the sphere.

14. A biomagnetometer operational verification tool, comprising:
a hollow sphere having a wall made of an electrically nonconducting and nonmagnetic material selected from the group consisting of glass and plastic, the radius of the sphere being about 10 centimeters and constant to within less than about 2 millimeters;
at least three noncolinear position locating tabs on the exterior wall of the sphere, the tabs being made of a metal that is visible in an X-ray of the sphere;
a mass of saline solution within the sphere, the fluid mass having substantially no bubbles therein;
at least two electrical dipole sources within the sphere, each dipole sources being formed of a twisted pair of platinum wires whose ends are spread apart to form a dipole having its centerline on the vertical radius of the sphere; and
a constant current supply for the dipole sources.

15. A process for verifying the operation of a biomagnetometer, comprising the steps of:
providing a biomagnetometer operational verification tool, comprising
a hollow sphere having a wall made of a material that is electrically nonconducting and nonmagnetic, the radius of the sphere being constant to within less than about 5 percent of the radius,
at least three noncolinear position locating tabs on the exterior wall of the sphere,
a mass of an electrically conducting fluid within the sphere, the fluid mass having substantially no bubbles therein,
at least one electrical dipole source at a known position within the sphere, and
a constant current supply for the dipole source;
establishing the position of the dipole source relative to the tabs;
determining the position of the tabs and the apparent strength of the dipole source using a biomagnetometer;
calculating the position and strength of the dipole source from the results of the steps of establishing and determining; and
comparing the position and strength of the dipole source from the step of calculating with the known position and strength of the dipole source.

16. The process of claim 15, wherein the tabs are made of a material that is opaque to X-rays, and the step of establishing includes the step of X-raying the sphere.

* * * * *